United States Patent [19]
Hoff, Jr.

[11] 4,100,437
[45] Jul. 11, 1978

[54] MOS REFERENCE VOLTAGE CIRCUIT

[75] Inventor: Marcian E. Hoff, Jr., Sunnyvale, Calif.

[73] Assignee: Intel Corporation, Santa Clara, Calif.

[21] Appl. No.: 709,719

[22] Filed: Jul. 29, 1976

[51] Int. Cl.[2] .......... H03K 3/26

[52] U.S. Cl. .......... 307/297; 307/304; 307/351; 323/22 R

[58] Field of Search .......... 307/296, 297, 304, 351, 307/291; 330/35, 22; 323/22 R, 16

[56] References Cited

U.S. PATENT DOCUMENTS

| | | | |
|---|---|---|---|
| 3,609,414 | 9/1971 | Pleshko | 307/304 |
| 3,628,070 | 12/1971 | Heuner | 307/304 |
| 3,700,981 | 10/1972 | Masuhara et al. | 307/304 |
| 3,806,742 | 4/1974 | Powell | 307/304 |
| 3,823,332 | 7/1974 | Feryszka et al. | 307/297 |
| 3,832,644 | 8/1974 | Nagata et al. | 330/22 |
| 3,975,648 | 8/1976 | Tobey, Jr. et al. | 307/297 |
| 3,975,649 | 8/1976 | Kawagoe et al. | 307/297 |

*Primary Examiner*—Stanley D. Miller, Jr.
*Assistant Examiner*—B. P. Davis
*Attorney, Agent, or Firm*—Blakely, Sokoloff, Taylor & Zafman

[57] ABSTRACT

An MOS integrated circuit for providing a stable reference voltage. The voltage thresholds of an enhancement mode transistor and depletion mode transistor are substracted to provide the stable reference potential. The reference potential is stable for both temperature and power supply variations, including variations in a substrate biasing potential.

13 Claims, 1 Drawing Figure

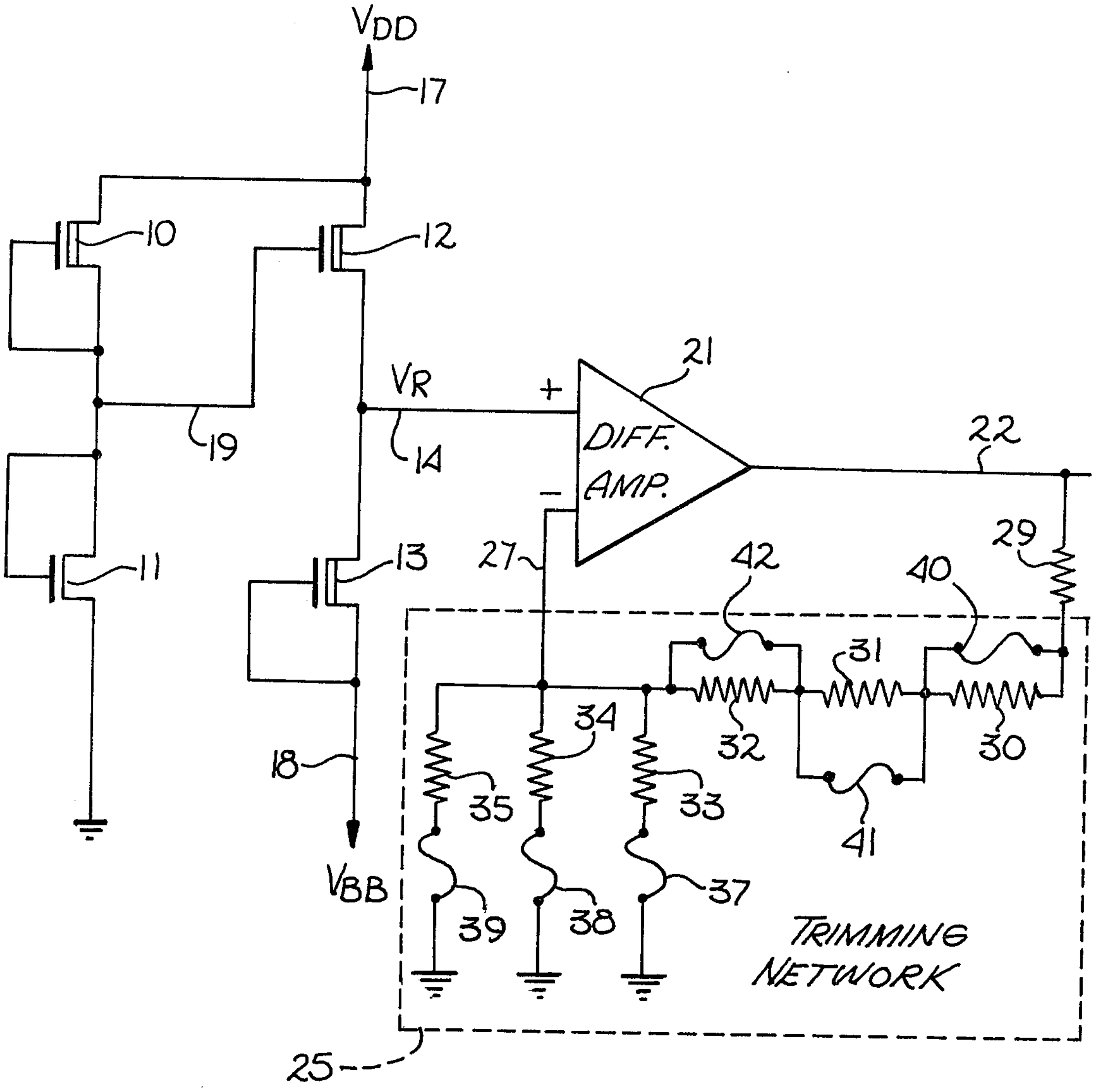
VDD
17
10
12
VR
+
21
DIFF.
AMP.
22
19
14
−
29
11
13
27
42
40
31
32
30
34
18
35
33
41
VBB
39
38
37
TRIMMING
NETWORK
25

MOS REFERENCE VOLTAGE CIRCUIT

BACKGROUND OF THE INVENTION

1. Field of the Invention

The invention relates to the field of reference voltage circuits particularly MOS circuits.

2. Prior Art

In many metal-oxide-semiconductor (MOS) integrated circuits, particularly digital circuits, a stable reference voltage is not needed. However, where MOS circuits are used in linear applications or to interface with analog circuits, a stable reference voltage is important. For example, in an MOS analog-to-digital converter or digital-to-analog converter a stable reference potential is needed. For the most part, where stable reference voltages are required for MOS integrated circuits, they are generally externally with bipolar components. This adds to the cost of employing MOS integrated circuits in many applications.

It is recognized that the threshold voltages of MOS devices vary with temperature. Also the threshold voltages of such devices, to some extent, vary with supply potentials, although this variaion may be minimized by operating the devices in saturation. However, even when an MOS device is operated in saturation, its threshold voltage will vary with changes in substrate biasing potentials. For a general discussion of the effects of temperature on MOS devices, see *MOS Field-Effect Transistors in Integrated Circuits,* by Paul Richmond, published by Wiley-Interscience Publications (1973) and in particular, Chapter 5, entitled "The Effect of Temperature Variations on the Electrical Characteristics of MOS Field-Effect Transistors."

The invented MOS circuit provides a stable reference voltage. The circuit is stable not only with temperature variations but also with power supply variations including changes in substrate biasing potentials. The circuit may be readily integrated on a substrate with other MOS circuits.

SUMMARY OF THE INVENTION

A metal-oxide-semiconductor (MOS) reference voltage circuit is disclosed. The circuit includes a first and second device of the same conductivity type having different threshold voltages. Circuit means are provided for subtracting the threshold voltages of these devices to provide the stable reference potential.

BRIEF DESCRIPTION OF THE DRAWING

The drawing is a schematic of the presently preferred embodiment of the invented MOS reference voltage circuit.

DETAILED DESCRIPTION OF THE INVENTION

An MOS reference voltage circuit is described. In its presently preferred embodiment the circuit is fabricated on a silicon substrate which substrate may include other integrated circuitry. As described the circuit employs n-channel, field-effect devices with polycrystalline silicon gates. It will be apparent to one skilled in the art that variations of the disclosed circuit may be employed. Known MOS technology may be employed to fabricate the invented circuit. In particular known processes may be used which result in formation of two devices on the same substrate of different thresholds and of the same conductivity type such as n-channel enhancement mode and depletion mode transistors.

Referring now to the FIGURE, for the n-channel embodiment described, a positive potential identified as $V_{DD}$, is employed and coupled to the circuit on line 17. By way of example, this potential may be between +5 and +12 volts. A negative potential is also employed, this potential is identified as $V_{BB}$, and is applied to the circuit on line 18. This potential, by way of example, may be from ground to −5 volts. $V_{BB}$ may be the potential used for substrate biasing, although this is not necessary.

Transistors 10 and 11 are coupled in series between line 17 and ground. Transistor 10 is a depletion mode transistor having its gate coupled to line 19. Transistor 11, an enhancement mode transistor, has its drain terminal and gate coupled to line 19 and its source terminal coupled to ground. Transistors 12 and 13 are coupled in series between lines 17 and 18. The depletion mode transistor 12 has its drain terminal coupled to line 17 and its gate coupled to line 19. The common terminal between transistors 12 and 13, line 14, provides the stable reference potential $V_R$. The source terminal of the depletion mode transistor 13 along with the gate of this transistor are coupled to line 18.

In the FIGURE a "chopper" stabilized differential amplifier 21 has one of its input terminals coupled to line 14. The other input terminal of this amplifier is coupled to the output line 22 through a trimming network 25. While the amplifier 21 and trimming network 25 are not necessary for the operation of the reference voltage circuit, they may be employed for purposes that will be described.

In general the stable reference voltage on line 14 is the difference between the voltage threshold of the enhancement mode transistor 11 and the voltage threshold of the depletion mode transistor 12. The depletion mode transistor 10, which is a relatively small device, is employed as a constant current source for transistor 11. The depletion mode transistor 13 also provides a relatively small constant current load for the transistor 12 which operates as a source follower. Thus, other known constant current source means may be employed in lieu of the depletion mode transistors 10 and 13.

The source-to-gate voltage drop of transistor 11 may be approximated by $V_{TE} + \delta_E$, where $V_{TE}$ is the voltage threshold of the enhancement mode transistor 11 and $\delta_E$ is a factor representing an additional voltage drop due to the current which flows through transistor 11. The source-to-gate voltage drop of transistor 12 may be approximated by $V_{TD} + \delta_D$, where $V_{TD}$ is the voltage threshold of the depletion mode transistor 12 and $\delta_T$ is a factor for the addition voltage drop due to the current through transistor 12. The reference potential $V_R$ (with respect to ground) may be written as $V_{TE} - V_{TD} + \delta_E - \delta_D$. $\delta_E$ and $\delta_D$ may be made approximately equal by well-known MOS circuit design techniques, for example, by the proper selection of the size of the various transistors in the circuit. Thus the effects of $\delta_E$ and $\delta_D$ cancel one another. The effect of temperature on the voltage threshold of the enhancement mode transistor 11 and the depletion mode transistor 12 are approximately equal, thus variations in the thresholds of these transistors due to temperature cancels one another. Also the effects of changes in source-to-substrate potential (substrate biasing potential) on $V_{TE}$ and $V_{TD}$ are approximately equal, thus these changes do not change $V_R$. The effects of variations in the $V_{DD}$ potential are minimized by the fact that transistors 10 and 12 are in saturation. Moreover, in the presently preferred embodiment, transistor 13 is in saturation, thereby minimizing the effects of changes in the $V_{BB}$ potential. In the presently preferred embodiment, transistors 10 and 12 have relatively long channels to minimize the short channel effects on voltage thresholds.

In a typical circuit $V_{TE}$ is approximately equal to one volt ± 0.3 volts and $V_{TD}$ is approximately equal to −3 volts ± 0.5 volts. Thus, $V_R$ will equal 4 volts ± 0.8 volts. It is apparent that the potential $V_R$, while stable, is not necessarily predictable. As is well-known the voltage thresholds in MOS devices vary considerably from die-to-die.

If a particular voltage is required a trimming network, such as trimming network 25, may be employed. The network 25, in the presently preferred embodiment, is used to control the feedback from line 22 to one input line 27 of the differential amplifier 21. By selectively adjusting the feedback, that is, by providing more feedback, or less feedback, the potential on line 22 may be either raised or lowered. In this manner, a predetermined reference potential, based on the potential $V_R$ (line 14) may be obtained on line 22.

The trimming network includes three series resistors 30, 31 and 32 which may be selectively coupled to line 22 through a resistor 29. Additionally, three parallel resistors 33, 34 and 35 are coupled between the input line 27 and ground. Selectively programmable devices are shunted across each of the series resistors 30, 31 and 32, and such devices are coupled in series with each of the parallel resistors 33, 34 and 35. In the presently preferred embodiment fusible links are employed. Other programmable means such as electrically programmable floating gate devices, or the like, may be used to obtain the same result. As shown in the FIGURE fuses 40, 41 and 42 are coupled across resistors 30, 31 and 32, respectively. Fuses 37, 38 and 39 are coupled in series with resistors 33, 34 and 35, respectively.

If the potential $V_R$ as sensed on line 22 is higher than desired, more feedback may be obtained by opening fuses 37, 38, or 39, or any combination of them. (Note the programming lines for opening the fuses 37 through 42 are not shown in the FIGURE). If on the other hand the potential on line 22 is lower than desired fuses 40, 41 or 42, or any combination thereof, may be opened. This will provide less feedback to the negative input of the differential amplifier 21, thereby raising the potential on line 22. In most applications both the series resistors and parallel resistors are not needed. For example, only the series resistors may be employed to raise the potential on line 22 to a desired level.

In the presently preferred embodiment the voltage difference between an enhancement mode and depletion mode transistor is employed to obtain the reference potential. Other transistors, of the same conductivity type and disposed on the same substrate may be employed if these transistors have different voltage thresholds. For example, two n-channel, enhancement mode transistors fabricated on the same substrate may be employed.

Thus, an MOS circuit has been described for providing a stable reference voltage. This stable reference is provided by circuit means which differences the voltage thresholds of a depletion mode transistor and an enhancement mode transistor. For the described circuit temperature coefficients of 0.001%/° C are obtainable for the range 0° to 70° C. A ± 10% change in substrate biasing potential results in only approximately a 0.1% change in $V_R$.

I claim:

1. An MOS reference voltage circuit disposed on a substrate and employing devices of the same conductivity type comprising:
- an enhancement mode device having a first threshold voltage coupled to receive a first current;
- a depletion mode device having a second threshold voltage said second threshold voltage being different than said first threshold voltage said depletion mode device coupled to receive a second current;
- circuit means for subtracting one of said first and second threshold voltages from the other of said first and second threshold voltages;
- whereby the difference in threshold voltages provides a temperature stable reference voltage.

2. The MOS reference voltage circuit defined by claim 1 wherein said enhancement mode device is coupled to a first constant current source which supplies said first current and wherein said depletion mode device is coupled to a second constant current source which supplies said second current.

3. The MOS reference voltage circuit defined by claim 2 wherein said first and second constant current sources each comprise a depletion mode transistor.

4. The MOS reference circuit defined by claim 2 including trimming means for adjusting said reference voltage to a predetermined level.

5. The MOS reference circuit defined by claim 4 wherein said trimming means includes selectively programmable devices.

6. An MOS reference voltage circuit comprising:
- an enhancement mode transistor;
- a first depletion mode transistor of the same conductivity type as said enhancement mode transistor;
- first current source means coupled to said enhancement mode transistors for providing a substantially constant current to said enhancement mode transistor;
- a second current source means coupled to said first depletion mode transistor for providing a substantially constant current to said first depletion mode transistor;
- the gate and one of the terminals of said enhancement mode transistor being coupled to the gate of said first depletion mode transistor;
- whereby the threshold voltages of said enhancement mode transistor and first depletion mode transistor are subtracted, thereby providing a stable reference voltage at one of the terminals of said first depletion mode transistor.

7. The reference voltage circuit defined by claim 6 wherein said first current source means comprises a second depletion mode transistor, said second depletion mode transistor being coupled to said enhancement mode transistor, and wherein said second current source means comprises a third depletion mode transistor, said third depletion mode transistor being coupled to said first depletion mode transistor.

8. The reference voltage circuit defined by claim 6 including trimming means for adjusting said reference voltage to a predetermined level.

9. An MOS circuit for providing a stable reference voltage circuit comprising:
- an n-channel enhancement mode transistor;

a first current source for coupling the drain terminal and gate of said enhancement mode transistor to a source of positive potential;

a first n-channel depletion mode transistor, the gate of said first depletion mode transistor coupled to said gate and drain terminal of said enhancement mode transistor, the drain terminal of said first depletion mode transistor coupled to said source of positive potential;

a second current source coupling the source terminal of said first depletion mode transistor with a source of a negative potential;

whereby the potential at the source terminal of said first depletion mode transistor is the difference between the threshold voltage of said enhancement mode transistor and the threshold voltage of said first depletion mode transistor, which voltage is temperature stable.

10. The circuit defined by claim 9 wherein said first current source comprises a second depletion mode transistor the gate and source terminal of said second depletion mode transistor coupled to said gate and drain terminal of said enhancement mode transistor.

11. The circuit defined by claim 10 wherein said second current source comprises a third depletion mode transistor the gate and source terminal of said third depletion mode transistor coupled to said source of negative potential.

12. The circuit defined by claim 11 including a trimming means for adjusting the output potential of said circuit to a predetermined voltage level.

13. The circuit defined by claim 12 wherein said trimming means includes a differential amplifier.

* * * * *